(12) United States Patent
Van De Ven et al.

(10) Patent No.: US 7,084,961 B2
(45) Date of Patent: Aug. 1, 2006

(54) SAFETY MECHANISM FOR A LITHOGRAPHIC PATTERNING DEVICE

(75) Inventors: Bastiaan Lambertus Wilhelmus Marinus Van De Ven, Den Bosch (NL); Gert-Jan Heerens, Schoonhoven (NL)

(73) Assignee: ASML Netherlands B.V., Veldhoven (NL)

( * ) Notice: Subject to any disclaimer, the term of this patent is extended or adjusted under 35 U.S.C. 154(b) by 13 days.

(21) Appl. No.: 10/740,822

(22) Filed: Dec. 22, 2003

(65) Prior Publication Data

US 2005/0134830 A1 Jun. 23, 2005

(51) Int. Cl.
G03B 27/62 (2006.01)
G03B 27/58 (2006.01)

(52) U.S. Cl. .......................................... 355/75; 355/72
(58) Field of Classification Search .................. 355/53, 355/74, 75, 76, 72; 356/29, 440
See application file for complete search history.

(56) References Cited

U.S. PATENT DOCUMENTS

| | | | | |
|---|---|---|---|---|
| 4,194,836 A | * | 3/1980 | Rapp et al. ..................... 355/75 |
| 5,682,228 A | * | 10/1997 | Miyake ........................ 355/75 |
| 5,844,666 A | * | 12/1998 | Van Engelen et al. ......... 355/72 |
| 5,980,187 A | * | 11/1999 | Verhovsky ............. 414/416.03 |
| 6,211,945 B1 | * | 4/2001 | Baxter et al. .................. 355/53 |
| 6,414,744 B1 | | 7/2002 | Kuiper et al. |
| 6,630,988 B1 | * | 10/2003 | Greene et al. ................. 355/75 |
| 2003/0025893 A1 | * | 2/2003 | Nishi .......................... 355/53 |
| 2003/0227605 A1 | * | 12/2003 | del Puerto et al. ............ 355/51 |
| 2004/0027551 A1 | * | 2/2004 | Barringer et al. ............. 355/75 |
| 2004/0027552 A1 | * | 2/2004 | Kikuchi et al. ............... 355/75 |
| 2004/0046947 A1 | * | 3/2004 | Yuan et al. ................... 355/53 |
| 2004/0057030 A1 | * | 3/2004 | Okubo et al. ................. 355/53 |
| 2004/0080730 A1 | * | 4/2004 | Binnard ....................... 355/53 |

* cited by examiner

Primary Examiner—W. B. Perkey
Assistant Examiner—Kevin Gutierrez
(74) Attorney, Agent, or Firm—Pillsbury Winthrop Shaw Pittman LLP (57) ABSTRACT

A lithographic apparatus equipped with a patterning device safety mechanism, is presented herein. In one embodiment, the apparatus comprises an illumination system for providing a beam of radiation, a support structure for supporting a patterning device that serves to impart the beam of radiation with a pattern in its cross-section, a substrate holder for holding a substrate having a plurality of target portions, a projection system for projecting the patterned beam onto the substrate target portions, a connector for securing the patterning device relative to the support structure; and a safety mechanism configured to reduce uncontrolled displacement of the patterning device in case of failure of the connector.

31 Claims, 4 Drawing Sheets

SAFETY MECHANISM FOR A LITHOGRAPHIC PATTERNING DEVICE

BACKGROUND OF THE INVENTION

1. Field of the Invention

The present invention relates to lithographic systems and, in particular, to safety mechanisms for lithographic patterning devices.

2. Description of the Related Art

The term "patterning device" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning device may differ substantially from the pattern eventually transferred to e.g. a substrate or layer thereof (e.g. where pre-biasing of features, optical proximity correction features, phase and/or polarization variation techniques, and/or multiple exposure techniques are used).

Generally, such a pattern will correspond to a particular functional layer in a device being created in the target portion, such as an integrated circuit or other device (see below). A patterning device may be reflective and/or transmissive. Examples of patterning device include:

mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

programmable mirror array: an example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from United States patents U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and programmable LCD array: an example of such a construction is given in United States patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth above.

A lithographic apparatus may be used to apply a desired pattern onto a surface (e.g. a target portion of a substrate). Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist).

In general, a single wafer will contain a whole matrix or network of adjacent target portions that are successively irradiated via the projection system (e.g. one at a time). Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper.

In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features.

This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer.

Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In known lithographic apparatus, the patterning device is carried by a support structure. The support structure is provided with a connector, which is adapted to fix the patterning device relative to the support structure.

The patterning device can be carried either on top of the support structure, or below the support structure. In both cases, it is desirable to prevent movements of the patterning device relative to the support structure in case of a failure of the connector as much as possible. Movements of the patterning device relative to the connector in the plane of the patterning device may lead to scratches or other damage of the patterning device and/or the connector or other parts of the support structure. Also, particles are likely to be generated, which pollute the environment inside the lithographic apparatus, or may cause damage. Should the patterning device fall off the support structure into the lithographic apparatus, substantial damage to the patterning device and to important machine parts of the lithographic apparatus is very likely.

SUMMARY OF THE INVENTION

Principles of the present invention, as embodied and broadly described herein, provide for a lithographic apparatus equipped with a patterning device safety mechanism, which is better secured against damage due to failure of the connector that fixes the patterning device relative to the support structure. In one embodiment, the apparatus comprises an illumination system for providing a beam of radiation, a support structure for supporting a patterning device that serves to impart the beam of radiation with a pattern in its cross-section, a substrate holder for holding a substrate having a plurality of target portions, a projection system for projecting the patterned beam onto the substrate target portions, a connector for securing the patterning device relative to the support structure, and a safety mechanism configured to reduce uncontrolled displacement of the patterning device in case of failure of the connector.

For reasons of clarity, a Cartesian coordinate system will now be defined to describe the various directions and planes necessary for understanding the invention. The plane of the patterning device is defined as the x-y-plane, and the direction perpendicular to that plane is defined as the z-direction. In general, the plane of the patterning device (the x-y-plane) will be substantially horizontal, and thus the z-direction (perpendicular to the plane of the patterning device), will be substantially vertical, so in the direction of gravity. However, the Cartesian coordinate system comprising the x-y-plane and the z-direction can also have a different orientation relative to the direction of gravity, depending on the orientation of the patterning device.

In a lithographic projection apparatus according to the invention, a safety mechanism reduces uncontrolled movements of the patterning device due to failure of the connector by physically retaining the patterning device when the fixation between the support structure and the patterning device is broken.

The operational sequence of a lithographic apparatus in general comprises a projection phase, in which the projection system is active. During the projection phase, a substrate, such as a wafer, is exposed. During the projection phase, a support structure carries the patterning device.

The operational sequence of a lithographic apparatus also comprises an exchange phase. During the exchange phase the patterning device is exchanged. In the exchange phase a positioning system positions the patterning device relative to the support structure for the patterning device. The positioning system comprises a reticle carrier, which carries the patterning device. The positioning can be performed in different ways, for example by measuring and control or by mechanical docking. After the positioning of the patterning device relative to the support structure of the patterning device, the support structure of the patterning device takes the patterning device over from the reticle carrier. A connector fixes the patterning device relative to the support structure and the reticle carrier moves away from the support structure.

Preferably, the safety mechanism is adapted to retain the patterning device in case of failure of the connector at least during the projection phase, because during the projection phase the consequences of failure of the connection are likely to be the largest.

In an advantageous embodiment the safety mechanism comprises one or more x-stops and one or more y-stops. The x-stops and y-stops together reduce any substantial movement of the patterning device relative to the support structure in the plane of the patterning device when the connector fails. The safety mechanism further comprises one ore more z-stops, reducing substantial displacement of the patterning device relative to the support structure in a direction out of the plane of the patterning device in case of connector failure. One or more of said x-stops, one or more of said y-stops and/or one or more of said z-stops are moveable to allow movements of the patterning device during the exchange phase which are necessary for placing patterning device onto the support structure and for removing patterning device from the support structure. Preferably, the moveable stops also allow movements of the positioning system, if required.

In this embodiment, the patterning device will be retained in at least the three translational degrees of freedom, and possibly in all six degrees of freedom.

It is advantageous to have at least three stops in the x-, y- as well as in the z-direction, being relatively positioned such that the patterning device is limited in its movements in all its degrees of freedom when the connector fails. This way, the patterning device is confined to a known space in the apparatus in the case of connector failure, so that the patterning device can easily be recovered after a connector failure.

Preferably, the stops are not in physical contact with the patterning device during normal operation of the lithographic projection apparatus in order to avoid deformation of the patterning device by the safety mechanism. This way, fatigue loads on the patterning device are avoided, and the projected image is more accurate. Also, by creating a distance between the stops and the patterning device, it is avoided that the patterning device becomes overconstrained. It has been found that a distance of 1–3 mm between each of the stops and the patterning device (when in its nominal position) functions well.

Preferably, the x-stops and the y-stops are attached to the support structure. This is advantageous, because this way, these stops move along with the patterning device as it performs its movements relative to the projection system, so the optimal distance between the stops and the patterning device is maintained when the support structure moves the patterning device.

It is envisaged that one or more x-stops and one or more y-stops are integrated into one or more x-y-stops, that prevent movement of the patterning device in the x-y-plane. This can for example be achieved by pins projecting through holes in one or more brackets, which brackets are attached to the patterning device.

In an advantageous embodiment the safety mechanism has a safety mode and an inactive mode, the safety mechanism in the safety mode protecting the lithographic apparatus and the patterning device from damage due to an uncontrolled displacement of the patterning device relative to the support structure, which displacement is caused by failure of the connector, at least during the projection phase. In this advantageous embodiment, the safety means is adapted to be operated in the exchange phase by positioning movements performed by the positioning system.

The embodiment is particularly advantageous since it provides a lithographic apparatus in which the patterning device is secured against failure of the connector that fixes the patterning device relative to the support structure, without increasing the idle time of the projection system.

Preferably, the safety mechanism comprises a flexible element and a holding element, the flexible element being attached to the support structure or the projection system, and the holding element being attached to the flexible element.

Preferably, the safety mechanism comprises at least three flexible elements, each provided with a respective holding element.

In a preferred embodiment, the flexible element is a leaf spring, to which a holding element is attached. In the safety mode, the spring leaf extends in z-direction (which is substantially perpendicular to the plane of the patterning device) away from the support structure or the projection system. This embodiment offers a cheap and reliable design.

In an alternative embodiment, the flexible element is a spring-mounted pin, which is positioned substantially in the x-y-plane (that is: the plane of the patterning device), and which is able to move in this x-y-plane along its longitudinal axis. Such a pin is preferably provided with an oblique face, that is adapted to be engaged by the positioning means, preferably by the reticle carrier. As the reticle carrier moves in z-direction towards the support structure, it pushes the pins aside to their inactive mode, so the patterning device can pass. When the reticle carrier releases the pins they re-assume their safety mode. In this alternative embodiment, the holding element can be an integral part of the flexible element.

In an other alternative embodiment, the holding elements are actuated by dedicated actuators.

It is envisaged that when it is required that one or more x-stops and/or one or more y-stops are moveable, they are designed in accordance with the above described design of the moveable z-stops.

In a preferred embodiment, the positioning system comprises a reticle carrier. The reticle carrier brings the patterning device to the support structure in the process of placing the pattering means onto the support structure. The reticle carrier also takes the patterning device away from the support structure in the process of removing the patterning device from the support structure. In this preferred embodiment, the reticle carrier is provided with an engaging means, that engages the flexible element and thus operates the safety mechanism.

According to a further aspect of the invention there is provided a device manufacturing method comprising providing a substrate that is at least partially covered by a layer of radiation-sensitive material, the substrate having a target portion, providing a projection beam of radiation using a radiation system, using patterning device to endow the projection beam with a pattern in its cross-section, thus creating a patterned beam, the patterning device being supported by a support structure, projecting the patterned beam of radiation onto a target portion of the layer of radiation-sensitive material, fixing the positioned patterning device to the support structure using a connector, providing a safety mechanism which is adapted to retain the patterning device in case of failure of the connector.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the figures, corresponding reference symbols indicate corresponding parts.

DETAILED DESCRIPTION

Lithographic Projection Apparatus

Figure 1:
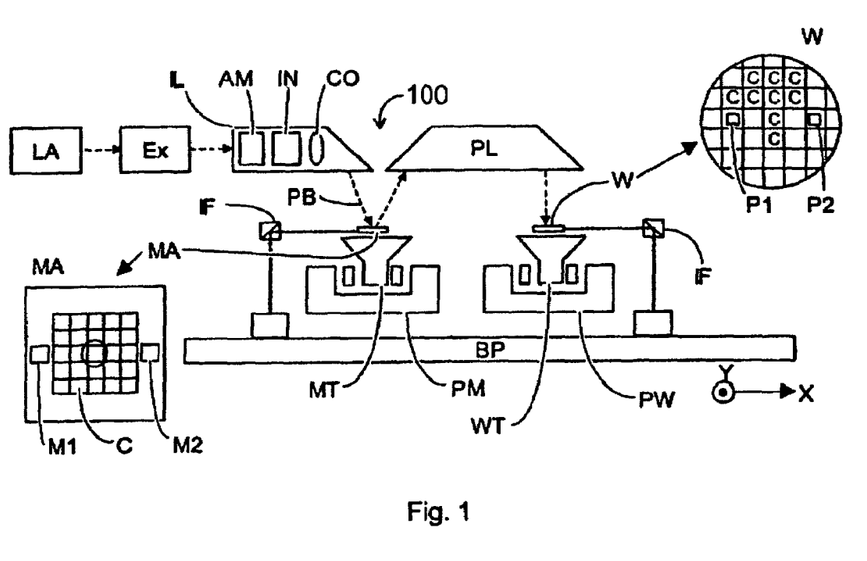
FIG. 1 depicts schematically a lithographic projection apparatus according to an embodiment of the invention.

FIG. 1 schematically depicts a lithographic apparatus 100 according to a particular embodiment of the invention. The apparatus 100 comprises:

- a radiation system Ex, IL: configured to supply a projection beam PB of radiation (e.g. UV radiation such as for example generated by an excimer laser operating at a wavelength of 248 nm, 193 nm or 157 nm, or by a laser-fired plasma source operating at 13.6 nm). In this particular case, the radiation system also comprises a radiation source SA;
- a first object table MT (mask table, mask holder): provided with a mask holder for holding a mask MA (e.g. a reticle), and connected to first positioning mechanism PM for accurately positioning the mask with respect to item PL;
- a second object table WT (substrate table, substrate holder): provided with a substrate holder for holding a substrate W (e.g. a resist-coated silicon wafer), and connected to second positioning mechanism PW for accurately positioning the substrate with respect to item PL and measurement structure IF (e.g., interferometric) to accurately indicate the position of the substrate and/or substrate table with respect to lens PL; and
- a projection system ("lens") PL: (e.g. a quartz and/or $CaF_2$ lens system or a catadioptric system comprising lens elements made from such materials, or a mirror system) configured to image an irradiated portion of the mask MA onto a target portion C (e.g. comprising one or more dies) of the substrate W.

As here depicted, the apparatus 100 is of a transmissive type (i.e., has a transmissive mask). However, in general, it may also be of a reflective type, for example (with a reflective mask). Alternatively, the apparatus 100 may employ another kind of patterning mechanism, such as a programmable mirror array of a type as referred to above.

The source LA (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field. For example, a beam delivery system BD may include suitable directing mirrors and/or a beam expander. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus 100 will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic apparatus 100 (as is often the case when the source LA is a mercury lamp, for example), but that it may also be remote from the lithographic apparatus 100, the radiation beam which it produces being led into the apparatus 100 (e.g., with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB.

Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus 100 can be used in various different modes, such as:

- step mode: the mask table MT is kept essentially stationary, and an entire mask image is projected in one go (i.e., a single "flash") onto a target portion C. The substrate table WT is then shifted in the x and/or y directions so that a different target portion C can be irradiated by the beam PB; and
- scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.
- other mode: the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

EMBODIMENTS

Figure 2A:
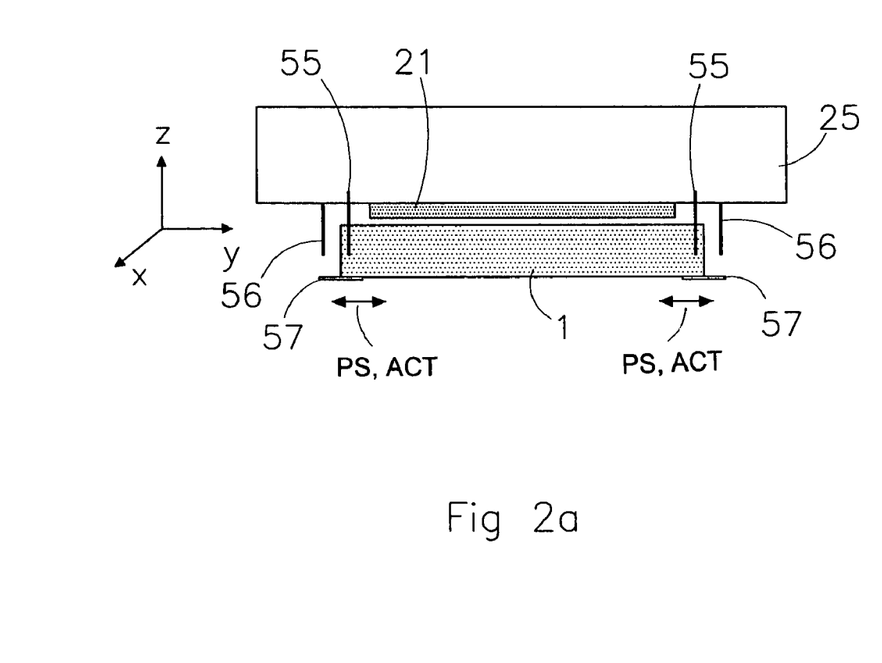
FIGS. 2A, 2B depict a schematic overview of a relevant part of a lithographic projection apparatus in an advantageous embodiment of a lithographic apparatus according to the invention.
Figure 2B:
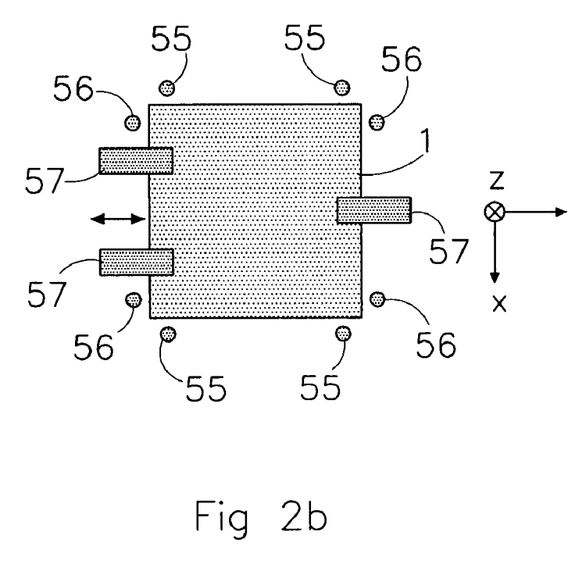

FIGS. 2A, 2B shows a schematic overview of a relevant part of a lithographic projection apparatus according to the invention. A reference coordinate system, comprising directions x, y and z is indicated in FIGS. 2A, 2B. As can be seen, the x-y-plane in the plane of the patterning device (in this case mask or reticle 1), and z is the direction perpendicular to that plane.

Figure 3A:
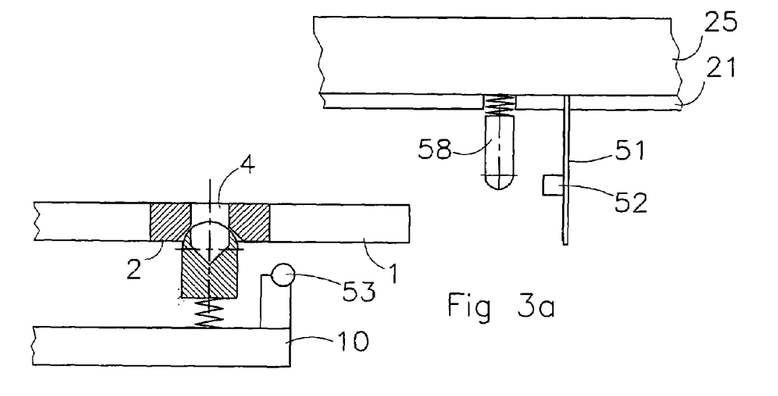
FIGS. 3A, 3B, 3C depict a schematic overview of operation of the safety system in an advantageous embodiment of a lithographic apparatus of the invention.
Figure 3B:
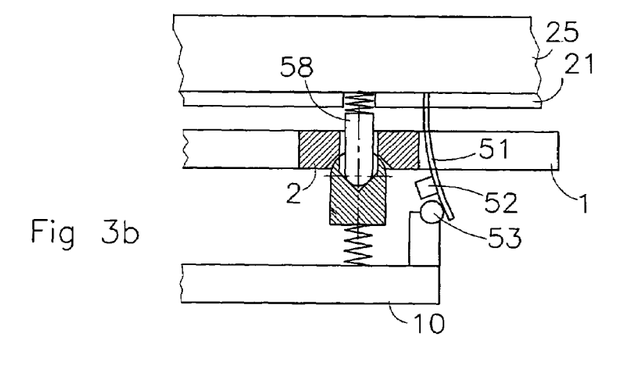
Figure 3C:
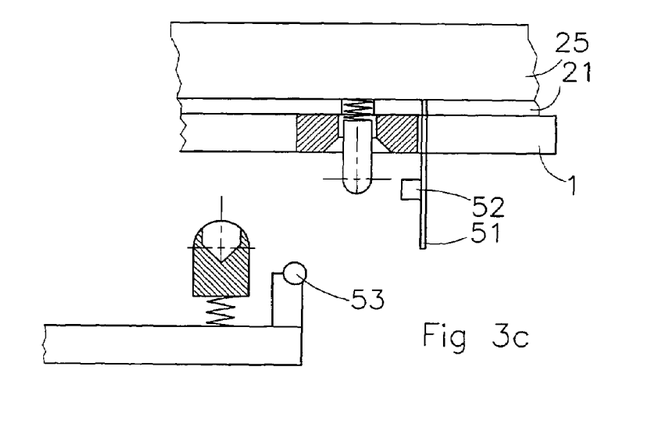

In the embodiments of FIGS. 2A, 2B and 3A–3C, the patterning device used is a reticle 1. This reticle 1 can either be transmissive of reflective. In the embodiment of FIGS. 3A, 3B, 3C, brackets 2 are provided at least three locations on the circumference of the reticle 1. It is however also envisaged that other measures are taken which allow the reticle 1 to be touched by machine parts, such as dedicated handling zones that are provided on the surface of the reticle 1 or interfaces other than brackets, such as a frame.

A support structure 25 is present to carry the reticle 1. The reticle 1 is fixed or secured to the support structure 25 by means of connector 21. This connector 21 can be for example an electrostatic clamp or a vacuum clamp. Also, the reticle 1 may be secured to the support structure by a mechanical connector that, for example, engages brackets 2. Such a mechanical connector may use force for fixing the reticle 1 to the support structure 25, or it may use elements with a shape that is complementary to the shape of part of the reticle 1 that is engaged by the connector. In the embodiments shown, the reticle 1 is carried below the support structure 25. However, the reticle 1 may also be carried on top of the support structure 25, for example inside a recess in the support structure.

In the embodiments of FIGS. 2A, 2B and FIGS. 3A, 3B, 3C, the operational cycle of the lithographic apparatus concerned has a projection phase, in which a patterned beam is projected onto a target portion of a substrate. During the projection phase, the reticle 1 is fixed to a support structure 25 by the connector. The operational cycle of the lithographic apparatus also has an exchange phase, in which the reticle 1 is exchanged, and in which a positioning system positions the reticle 1 relative to the support structure 25. Also during the exchange phase, at least a part of the positioning system, such as a reticle carrier, is withdrawn after the reticle 1 has been positioned.

The positioning system comprises a reticle carrier 10 which moves and positions the reticle 1 relative to the support structure 25 during the exchange phase.

In the embodiment of FIGS. 2A, 2B, the safety mechanism comprises four x-directed stopping structures or x-stops 55 and four y-directed stopping structures or y-stops 56. The x-stops 55 and the y-stops 56 together reduce any uncontrolled displacement of the reticle 1 in the x-y-plane due to failure of connector 21. It will be appreciated that a different number of stops may be used.

It has been found that in case of connector failure during any of movements of the support structure 25 in the x-y-plane, the reticle 1 does not only move in the direction of gravity, but that it also is displaced in the x-y-plane, regardless of the orientation of the x-y-plane relative to the direction of gravity. This displacement in the x-y-plane is due to the velocity and/or the acceleration (including gravity) of the reticle 1 in the x-y-plane during its movements.

Uncontrolled displacement of the reticle 1 in the x-y-plane due to failure of the connector 21 needs to be reduced since movements of the reticle 1 relative to the support structure 25 cause slip between the reticle 1 and the support structure 25. This could lead to scratches on the reticle 1 and/or on the support structure 25. Scratches on the connector 21 are particularly disadvantageous. Also, particles are likely to be created that contaminate the environment inside the lithographic apparatus.

Electrostatic clamps are a good option for use as a connector 21 for securing or fixing the reticle 1 to the support structure 25. Such clamps are however particularly sensitive to scratches and particles. When a vacuum clamp is used as a connector 21, scratches and particles may cause problems in reaching the required vacuum pressure. Also, such clamps are sensitive to faults in the flatness of the clamping face. Such faults can be caused by failure of the connector 21.

In the embodiment of FIGS. 2A, 2B, the safety mechanism also comprises three z-directed stopping structures or z-stops 57, preventing the reticle 1 from uncontrolled displacement relative to the support structure in a direction out of the plane of the reticle 1, at least during the projection phase. The z-stops 57 are moveable to allow a reticle 1 being mounted onto or dismounted from the support structure during the exchange phase.

It will be appreciated that uncontrolled displacement in the direction of gravity is undesirable, since it will result in the reticle 1 falling into the lithographic apparatus. This will damage the reticle 1 and very likely also parts of the lithographic apparatus.

When a reticle 1 is exchanged (e.g., taking a first reticle off the support structure 25 and replacing it with a second reticle), the respective reticles are moved relative to the support structure 25. If all stops would be fixed relative to the support structure 25, they would be in the way when the reticle 1 is exchanged. Therefore, some of the stops are moveable, so that they can be moved out of the path the respective reticles during the exchange phase. Of course, the moveable stops are adapted to be moved out of the way of the reticle carrier 10 (or other parts of the positioning system) that handles the reticles during the exchange phase too. The moveable stops can be operated by the positioning system PS or by dedicated actuators ACT.

In this embodiment the z-stops 57 are moveable, as the reticle 1 is brought to the support structure 25 in z-direction in the process of placing the reticle 1 on the support structure, and the reticle 1 is also moved away from the support structure 25 in z-direction when removing the reticle 1 from the support structure. It is however envisaged that the reticle 1 is place onto and/or removed from the support structure in a different direction. In that case, other stops have to be moveable.

Preferably, all stops together define a space around the normal position of the reticle 1, which defined space is just a bit larger than the space the reticle 1 takes up during normal operation. This way, the reticle 1 can be recovered after a connector failure in the same way in which a reticle 1 is exchanged. For this purpose, a distance of 1–3 mm between the stops and the reticle 1 (when the reticle 1 occupies its nominal position) has shown to be suitable.

In general, it is advantageous if the stops are not in physical contact with the reticle 1 during normal operation of the lithographic projection apparatus. This in order to avoid deformation of the reticle 1 by the safety mechanism. This way, fatigue loads on the reticle 1 are avoided, and the projected image is more accurate. Also, by creating a distance between the stops and the reticle 1, it is avoided that the reticle 1 becomes over-constrained. Also for this purpose, a distance of 1–3 mm between each stop and the reticle has been found to be suitable.

In the embodiment of FIGS. 3A, 3B, 3C, elements 58 project through holes 4 in brackets 2 that are attached to reticle 1. These elements 58 serve as combined x-y-stops, as together they prevent uncontrolled movement of the reticle 1 in the x-y-plane due to failure of the connector 21, at least during the projection phase.

Also in FIGS. 3A, 3B, 3C, also an advantageous embodiment of the z-stops is shown. In this embodiment a part of the positioning system such as the reticle carrier 10 shifts the safety mechanism from a safety mode to a inactive mode, and back again into the safety mode.

In the safety mode, the safety mechanism is in the position that it assumes when it is not engaged by the positioning system. The safety mode is the mode in which the safety mechanism provides safety for the reticle 1 and the lithographic apparatus against connector failure, as well as the safety mechanism's idle mode when there is no reticle 1 at or close to the support structure 25. The inactive mode is the mode in which it is possible for the reticle 1 to pass the safety mechanism. The safety mechanism is in this position when a reticle 1 is either in the process of being mounted to the support structure 25 or in the process of being dismounted from it.

In the shown embodiment, the safety mechanism is activated by movements of the reticle carrier 10, which movements the reticle carrier 10 has to carry out anyway for positioning the reticle 1 relative to the projection system, mounting the reticle onto the support structure 25 or dismounting the reticle 1 from the support structure 25. These movements include the withdrawal of the reticle carrier 10 after the reticle 1 is fixed to the support structure by the connector 21.

This way, activation and deactivation of the safety mechanism do not require any additional idle time of the projection system. It also eliminates the need for dedicated actuators and the control system related to their presence. Therefore, the additional safety against machine damage due to the reticle 1 being released from the support structure 21 because of connector failure does not bring about reduction of the throughput that can be realized by the lithographic apparatus.

The safety mechanism in this embodiment comprises three flexible elements 51, each provided with a holding element 52. In the shown embodiment, the flexible element 51 is a leaf spring. A reticle carrier 10, which is a part of the positioning system that positions the reticle 1 relative to the support structure 25 in the exchange phase, is additionally provided with three engaging means 53. Each of the engaging means is adapted to engage a flexible element or holding element.

During the movement of the reticle carrier 10 towards the support structure 25 in the exchange phase, the reticle carrier 10 engages the flexible element 51, bending it away or otherwise moving it out of the path of the reticle 1. This way, the holding element 52 is moved out of the path the reticle 1 follows during its positioning. During the withdrawal of the reticle carrier 10, the reticle carrier 10 releases the leaf spring. Thus, the flexible elements 51 with the holding elements 52 regain their safety mode, in which the holding element 52 is situated under the reticle 1.

When the reticle 1 has to be dismounted from the support structure 25 during the next exchange phase, the reticle carrier 10 moves towards the reticle 1 again. While the reticle carrier 10 approaches the reticle 1, it bends the flexible element 51s away, thus moving the holding element 52s outwardly (that is: out of the area under the reticle 1). As the holding element 52s are then no longer under reticle 1, the reticle 1 can pass the holding element 52s in z-direction while the reticle 1 is removed from the support structure 25 by the reticle carrier 10.

The operation of the safety mechanism is best illustrated by FIGS. 3A, 3B and 3C. In FIG. 3A the safety mechanism is in its safety mode. No force is exerted on the flexible element 51. In the situation of FIG. 3B, reticle carrier 10 approaches the support structure 25. The engaging means 53 engages the flexible element 51 and pushes it outwardly, so the respective bracket 2 of the reticle 1 can pass the holding element 52. The safety mechanism is now in its inactive mode. When the reticle carrier 10 is withdrawn, as is shown in FIG. 3C, the safety mechanism re-assumes its safety mode. The holding element 52 is now under the respective bracket 2. Should connector 21 fail, the holding elements 52 together prevent the reticle 1 from falling down into the apparatus by supporting the reticle 1 in z-direction.

For dismounting the reticle 1 from the support structure 25, the procedure is repeated in the reverse way.

Figure 4:
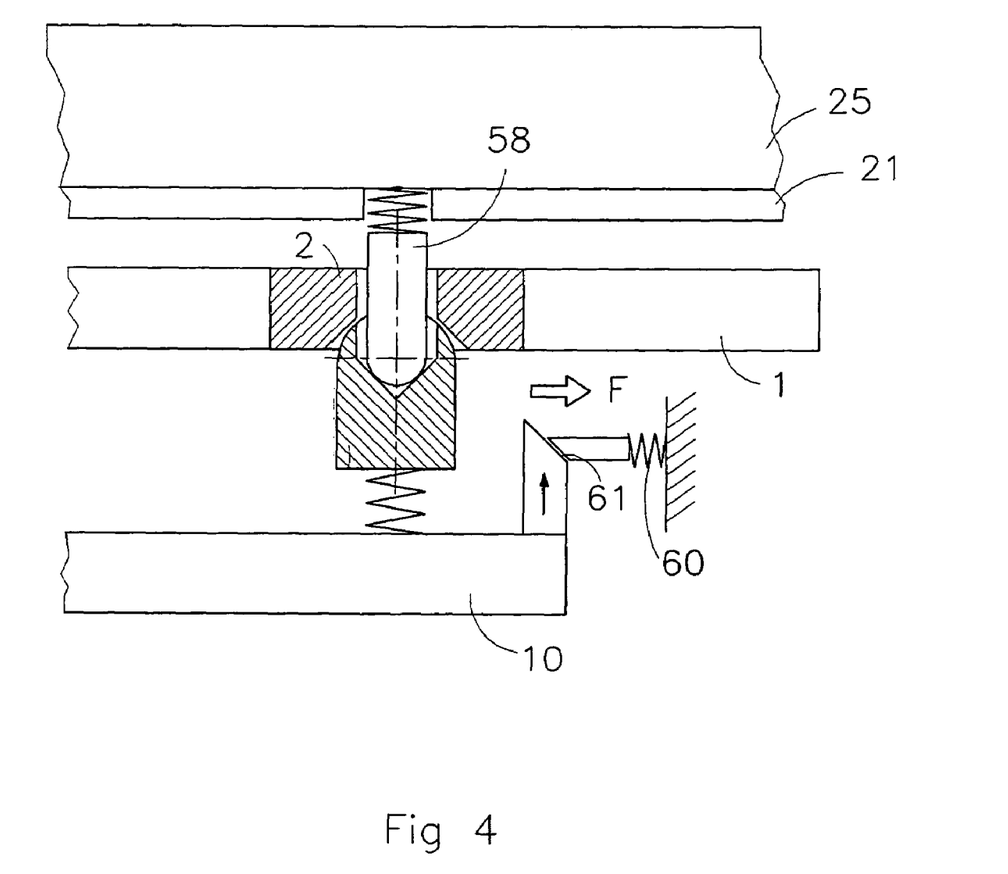
FIG. 4 depicts an alternative embodiment of the embodiment according to FIGS. 3A–3C.

FIG. 4 shows an alternative embodiment of the advantageous embodiment according to FIGS. 3A, 3B, 3C. In this alternative embodiment, the flexible element is a spring-mounted pin 60, which is positioned substantially in the x-y-plane (that is: the plane of the patterning device), and which is able to move in this x-y-plane along its longitudinal axis.

Pin 60 is preferably provided with an oblique face 61, that is adapted to be engaged by the positioning means, preferably by the reticle carrier 10. As the reticle carrier 10 moves in z-direction towards the projection system, it pushes the pins 60 aside to their inactive mode in the direction of arrow F, so the patterning device can pass. When the reticle carrier releases the pins 60 they re-assume their safety mode. In this alternative embodiment, the holding element can be an integral part of the flexible element.

Whilst specific embodiments of the invention have been described above, it will be appreciated that the invention may be practiced otherwise than as described. The embodiments described above may, instead, be implemented in different embodiments of software, firmware, and hardware in the entities illustrated in the figures.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus comprising:
   an illumination system for providing a beam of radiation;
   a support structure for supporting a patterning device that serves to impart said beam of radiation with a pattern in its cross-section;
   a substrate holder for holding a substrate having a plurality of target portions;
   a projection system for projecting said patterned beam onto said substrate target portions;
   a positioning system for positioning said patterning device relative to said support structure;
   a connector for securing said patterning device relative to said support structure;

a safety mechanism configured to contain displacement of said patterning device in case of failure of said connector; and a lithographic operational cycle, comprising:

a projection phase in which, while said patterned beam is projected onto a target portion of the substrate, said patterning device is secured to said support structure by said connector, and an exchange phase, in which said patterning device is exchanged, said positioning system positions said patterning device relative to said support structure, and at least a part of said positioning system is withdrawn after said patterning device has been positioned, wherein said safety mechanism is configured to contain said patterning device in case of failure of said connector at least during the projection phase.

2. The lithographic projection apparatus of claim 1, wherein said safety mechanism comprises:

at least one x-directed stopping structure and at least one y-directed stopping structure, said x-directed stopping structure and said y-directed stopping structure configured to contain said patterning device relative to the support structure in the xy plane of said patterning device, at least one z-directed stopping structure, said z-directed stopping structure configured to contain said patterning device relative to said support structure in a direction out of the xy plane of said patterning device, wherein at least one of said x-directed stopping structure, y-directed stopping structure, z-directed stopping structure are moveable to allow movement of said patterning device during the exchange phase.

3. The lithographic projection apparatus of claim 2, wherein said safety mechanism comprises at least three x-directed stopping structures, at least three y-directed stopping structures, and at least three z-directed stopping structures.

4. The lithographic projection apparatus of claim 2, wherein the moveable stops are operated by said positioning system.

5. The lithographic projection apparatus of claim 2, wherein the moveable stops are operated by dedicated actuators.

6. The lithographic projection apparatus of claim 2, wherein the distance between said x-directed stopping structure, y-directed stopping structure, and z-directed stopping structure and said patterning device when the patterning device occupies its nominal position relative to said support structure, is 1–3 mm.

7. The lithographic projection apparatus of claim 2, wherein said x-directed stopping structure and y-directed stopping structure are attached to said support structure.

8. The lithographic projection apparatus of claim 2, wherein said safety mechanism comprises at least an integrated xy-directed stopping structure.

9. The lithographic projection apparatus of claim 1, wherein said positioning system is configured to perform in the exchange phase, positioning movements that are required for positioning said patterning device relative to said support structure, including the withdrawal of at least a part of said positioning system after said patterning device has been positioned, wherein said safety mechanism is equipped with a safety mode and an inactive mode and said safety mechanism is configured to contain said patterning device in case of failure of the connector in the safety mode, and wherein said safety mechanism is configured to operate in the exchange phase by one or more positioning movements of said positioning system.

10. The lithographic projection apparatus of claim 9, wherein said safety mechanism comprises a flexible element and a holding element, the flexible element being attached to at least one of said support structure and said projection system, and the holding element being attached to the flexible element.

11. The lithographic projection apparatus of claim 10, wherein the flexible element is a leaf spring.

12. The lithographic projection apparatus of claim 10, wherein the flexible element is a spring mounted pin.

13. The lithographic projection apparatus of claim 10, wherein said safety mechanism comprises three flexible elements, each being provided with a holding element.

14. The lithographic projection apparatus of claim 9, wherein said positioning system comprises a reticle carrier that is configured to operate said safety mechanism.

15. The lithographic projection apparatus of claim 9, wherein the part of said positioning system that operates said safety mechanism comprises an interface adapted to engage said safety mechanism.

16. A device manufacturing method, comprising:

providing a substrate having a plurality of target portions;

providing a beam of radiation using an illumination system;

employing a patterning device to impart said beam of radiation with a pattern in its cross-section, said patterning device being supported by a support structure;

positioning said patterning device relative to said support structure by employing a positioning system securing said positioned patterning device to the support structure using a connector;

providing a safety mechanism configured to contain said patterning device in case of failure of said connector;

projecting said patterned beam of radiation onto at least one of said target portions of the substrate by a projection system; and providing a lithographic operational cycle, comprising:

a projection phase in which, while said patterned beam is projected onto a target portion of the substrate, said patterning device is secured to said support structure by said connector, and an exchange phase, in which said patterning device is exchanged, said positioning system positions said patterning device relative to said support structure, and at least a part of said positioning system is withdrawn after said patterning device has been positioned, wherein said safety mechanism is configured to contain said patterning device in case of failure of said connector at least during the projection phase.

17. The device manufacturing method of claim 16, further including:

providing said safety mechanism with at least one x-directed stopping structure and at least one y-directed stopping structure, said x-directed stopping structure and said y-directed stopping structure configured to contain said patterning device relative to the support structure in the xy plane of said patterning device, providing said safety mechanism with at least one z-directed stopping structure, said z-directed stopping structure configured to contain said patterning device relative to said support structure in a direction out of the xy plane of said patterning device, wherein at least one of said x-directed stopping structure, y-directed stopping structure, z-directed stopping structure are moveable to allow movement of said patterning device during the exchange phase.

18. The device manufacturing method of claim 17, wherein said safety mechanism comprises at least three x-directed stopping structures, at least three y-directed stopping structures, and at least three z-directed stopping structures.

19. The device manufacturing method of claim 17, wherein the moveable stops are operated by said positioning system.

20. The device manufacturing method of claim 17, wherein the moveable stops are operated by dedicated actuators.

21. The device manufacturing method of claim 17, wherein the distance between said x-directed stopping structure, y-directed stopping structure, and z-directed stopping structure and said patterning device when the patterning device occupies its nominal position relative to said support structure, is 1–3 mm.

22. The device manufacturing method of claim 17, wherein said x-directed stopping structure and y-directed stopping structure are attached to said support structure.

23. The device manufacturing method of claim 17, wherein said safety mechanism comprises at least an integrated xy-directed stopping structure.

24. The device manufacturing method of claim 16, further including:
performing, during the exchange phase, positioning movements by said positioning mechanism that are required for positioning said patterning device relative to said support structure, including the withdrawal of at least a part of said positioning system after said patterning device has been positioned,
equipping said safety mechanism with a safety mode and an inactive mode such that said safety mechanism is configured to contain said patterning device in case of failure of the connector in the safety mode, and
operating said safety mechanism during the exchange phase, by one or more positioning movements of said positioning system.

25. The device manufacturing method of claim 24, wherein said safety mechanism comprises a flexible element and a holding element, the flexible element being attached to at least one of said support structure and said projection system, and the holding element being attached to the flexible element.

26. The device manufacturing method of claim 25, wherein the flexible element is a leaf spring.

27. The device manufacturing method of claim 25, wherein the flexible element is a spring mounted pin.

28. The device manufacturing method of claim 24, wherein said positioning system comprises a reticle carrier that is configured to operate said safety mechanism.

29. The device manufacturing method of claim 25, wherein said safety mechanism comprises three flexible elements, each being provided with a holding element.

30. The device manufacturing method of claim 24, wherein the part of said positioning system that operates said safety mechanism comprises an interface adapted to engage said safety mechanism.

31. A lithographic apparatus comprising:
means for providing a beam of radiation;
means for patterning said beam of radiation with a pattern in its cross-section;
means for supporting said patterning means;
means for holding a substrate having a plurality of target portions;
means for projecting said patterned beam onto said substrate target portions;
means for positioning said patterning device relative to said support structure;
means for securing said patterning device relative to said support means; and
means for containing said patterning means in case of failure of said securing means; and
means for providing a lithographic operational cycle, comprising:
a projection phase in which, while said patterned beam is projected onto a target portion of the substrate, said patterning means is secured to said supporting means by said securing means, and
an exchange phase in which said patterning means is exchanged, said positioning means positions said patterning means relative to said support means, and at least a part of said positioning means is withdrawn after said patterning means has been positioned,
wherein said containing means is configured to contain said patterning means in case of failure of said securing means at least during the projection phase.

* * * * *